(12) United States Patent
San et al.

(10) Patent No.: US 7,865,347 B1
(45) Date of Patent: *Jan. 4, 2011

(54) FINITE IMPULSE RESPONSE (FIR) FILTER COMPILER FOR ESTIMATING COST OF IMPLEMENTING A FILTER

(75) Inventors: Tony San, Sunnyvale, CA (US); Philippe Molson, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/343,401

(22) Filed: Dec. 23, 2008

Related U.S. Application Data

(63) Continuation of application No. 11/505,710, filed on Aug. 16, 2006, now Pat. No. 7,480,603, which is a continuation of application No. 09/773,853, filed on Jan. 31, 2001, now Pat. No. 7,110,927.

(60) Provisional application No. 60/184,226, filed on Feb. 23, 2000, provisional application No. 60/184,736, filed on Feb. 23, 2000, provisional application No. 60/184,396, filed on Feb. 23, 2000, provisional application No. 60/186,575, filed on Mar. 2, 2000.

(51) Int. Cl.
*G06G 7/02* (2006.01)
*G06G 7/62* (2006.01)

(52) U.S. Cl. ............................ 703/13; 703/14; 708/819; 708/300

(58) Field of Classification Search ................... 703/13, 703/14; 708/819, 300
See application file for complete search history.

(56) References Cited

U.S. PATENT DOCUMENTS

| 4,835,723 | A | | 5/1989 | Hansen |
|---|---|---|---|---|
| 5,117,349 | A | | 5/1992 | Tirfing et al. |
| 5,546,477 | A | | 8/1996 | Knowles et al. |
| 5,732,107 | A | * | 3/1998 | Phillips et al. ............... 375/296 |
| 5,937,184 | A | * | 8/1999 | Rao ............................ 703/20 |
| 6,401,230 | B1 | | 6/2002 | Ahanessians et al. |
| 6,570,842 | B1 | | 5/2003 | Landolsi |
| 6,600,788 | B1 | | 7/2003 | Dick et al. |
| 7,110,927 | B1 | | 9/2006 | San et al. |
| 7,480,603 | B1 | | 1/2009 | San et al. |

OTHER PUBLICATIONS

Rajeev Jain, et al.; "Custom Design of a VLSI PCM-FDM Transmultiplexer from System Specifications to Circuit Layout Using a Computer-Aided Design System"; 1986; IEEE; pp. 183-195.*

(Continued)

*Primary Examiner*—Jason Proctor
(74) *Attorney, Agent, or Firm*—Weaver Austin Villeneuve & Sampson LLP

(57) ABSTRACT

A method, apparatus and a filter compiler system for building a filter is disclosed. The filter compiler system includes a filter resource estimator. The filter resource estimator is configured to estimate an implementation cost of the filter. The filter compiler system determines whether the implementation cost is acceptable and updates a design of the filter upon determining that the implementation cost is unacceptable.

28 Claims, 16 Drawing Sheets

OTHER PUBLICATIONS

Masaki Ishikawa, et al.; "Automatic Layout Synthesis for FIR Filters Using Silicon Computer"; 1990; IEEE; pp. 2588-2591.*
Shung et al., "An Integrated CAD System for Algorithm-Specific IC Design," IEEE Transactions on Computer-Aided Design, vol. 10, No. 4, Apr. 1991.
Saramaki et al., "Design of Computationally Efficient Interpolated FIR Filters," IEEE Transactions on Circuits and Systems, vol. 35, No. 1, Jan. 1988.
Mintzer, Les, "Digital Filtering in FPGA's," 1994 Conference Record of the Twenty-eighth Asilomar Conference on Signals, Systems and Computers, vol. 2, pp. 1373-1377, 1994.
Jain et al., "FIRGEN: A Computer-Aided Design System for High Performance FIR Filter Integrated Circuits," IEEE Transactions on Signal Processing, vol. 39, No. 7, Jul. 1991.
Altera News & Views First Quarter Feb. 2000, pp. 1-44.
Hussein et al., "Design and Verification Techniques Used in a Graduate Level VHDL Course," IEEE Frontiers in Education Conference, Nov. 10-13, pp. 28-31, 1999.
FIR Compiler MegaCore Function Version 2.6.0, pp. 1-5, 1995-2003.
"The Altera Advantage News and Views," pp. 1-31, May 1997.
"FIR Compiler MegaCore Function" Solution Brief, ver. 1, pp. 1-4, Jun. 1999.
Mathworks, Inc., "Student Edition of Matlab,", pp. 38, 39, 256, 257, 335-345, 1997.
Bishop-R.H., "Modern Control Systems Analysis and Design Using Matlab & Simulink," pp. 95-101, 192-207, 211-214, 1997.
Emingolu et al., "A CAD Environment for Digital Filters Using a VerilogHDL Based Functional Bit-Serial Compiler," 10th International Conference Monastir Tunisia (abstract), pp. 91-94, 1998.
Baicher et al., "Learning About Digital Signal Processing Using Spreadsheets and Simulation Software," pp. 41-48, 1996.
Office Action dated Jul. 15, 2004 for U.S. Appl. No. 09/773,853.
Office Action dated Dec. 17, 2004 for U.S. Appl. No. 09/773,853.
Office Action dated Jul. 12, 2005 for U.S. Appl. No. 09/773,853.
Office Action dated Jan. 4, 2006 for U.S. Appl. No. 09/773,853.
Notice of Allowance dated May 18, 2006 for U.S. Appl. No. 09/773,853.
OA dated Aug. 27, 2007 from U.S. Appl. No. 11/505,710.
Final OA dated Mar. 6, 2008 from U.S. Appl. No. 11/505,710.
Notice of Allowance dated Sep. 12, 2008 from U.S. Appl. No. 11/505,710.

* cited by examiner

INPUT DATA BUS PARAMETERS

SPECIFY COEFFICIENTS

SCALED AND ROUNDED COEFFICIENTS

SPECIFY FILTER PRECISION

SPECIFY DECIMATION OR INTERPOLATION

ARCHITECTURE

NUMBER OF INPUT CHANNELS [ 1 ]

PARALLEL IMPLEMENTATION ○
SERIAL IMPLEMENTATION ●
PIPELINING OPTIONS

SPEED OPTIMIZED ○
AREA OPTIMIZED ○

ESTIMATED RESOURCES OPTIONS

SIZE ESTIMATE    180 LOGIC CELLS    1602

3 DUAL PORT ESB/EAB

COMPUTATION TIME    4 CLOCK CYCLES PER INPUT

4 CLOCK CYCLES PER OUTPUT

[ CANCEL ] [ BACK ] [ APPLY ] [ NEXT ]

1600

SPECIFY FILTER ARCHITECTURE

Fig. 14

FINITE IMPULSE RESPONSE (FIR) FILTER COMPILER FOR ESTIMATING COST OF IMPLEMENTING A FILTER

CROSS-REFERENCE TO RELATED APPLICATIONS

This application is a continuation of and claims the benefit of priority of allowed U.S. patent application Ser. No. 11/505,710, filed on Aug. 16, 2006, titled "FINITE IMPULSE RESPONSE (FIR) FILTER COMPILER", which is a continuation of and claims the benefit of priority of U.S. application Ser. No. 09/773,853, filed on Jan. 31, 2001, titled "FINITE IMPULSE RESPONSE (FIR) FILTER COMPILER", issued as U.S. Pat. No. 7,110,927, which claims the benefit of priority under 35 U.S.C. 119(e) of U.S. Provisional Application No. 60/184,226 filed on Feb. 23, 2000, titled "FINITE IMPULSE RESPONSE (FIR) FILTER COMPILER", now expired, all of which are incorporated by reference herein in their entirety and for all purposes.

This application is a continuation of and claims the benefit of allowed U.S. patent application Ser. No. 11/505,710, filed on Aug. 16, 2006, titled "FINITE IMPULSE RESPONSE (FIR) FILTER COMPILER", which is a continuation of and claims the benefit of priority of U.S. application Ser. No. 09/773,853, filed on Jan. 31, 2001, titled "FINITE IMPULSE RESPONSE (FIR) FILTER COMPILER", issued as U.S. Pat. No. 7,110,927, which claims the benefit of priority under 35 U.S.C. 119(e) of U.S. Provisional Application No. 60/184,736, filed on Feb. 23, 2000 titled "FINITE IMPULSE RESPONSE (FIR) FILTER COMPILER FOR PROVIDING A SINGLE CLOCK DOMAIN FOR A DECIMATING FIR WITH POLYPHASE DECOMPOSITION AND SERIAL ARITHMETIC", now expired, all of which are incorporated by reference herein in their entirety and for all purposes.

This application is a continuation of and claims the benefit of allowed U.S. patent application Ser. No. 11/505,710, filed on Aug. 16, 2006, titled "FINITE IMPULSE RESPONSE (FIR) FILTER COMPILER", which is a continuation of and claims the benefit of priority of U.S. application Ser. No. 09/773,853, filed on Jan. 31, 2001, titled "FINITE IMPULSE RESPONSE (FIR) FILTER COMPILER", issued as U.S. Pat. No. 7,110,927, which claims the benefit of priority under 35 U.S.C. 119(e) of U.S. Provisional Application No. 60/184,396, filed on Feb. 23, 2000 titled "FINITE IMPULSE RESPONSE (FIR) FILTER COMPILER FOR PROVIDING A SINGLE CLOCK DOMAIN FOR AN INTERPOLATING FIR FILTER WITH POLYPHASE DECOMPOSITION AND SERIAL ARITHMETIC, now expired, all of which are incorporated by reference herein in their entirety and for all purposes.

This application is a continuation of and claims the benefit of allowed U.S. patent application Ser. No. 11/505,710, filed on Aug. 16, 2006, titled "FINITE IMPULSE RESPONSE (FIR) FILTER COMPILER", which is a continuation of and claims the benefit of priority of U.S. application Ser. No. 09/773,853, filed on Jan. 31, 2001, titled "FINITE IMPULSE RESPONSE (FIR) FILTER COMPILER", and issued as U.S. Pat. No. 7,110,927, which claims the benefit of priority under 35 U.S.C. 119(e) of U.S. Provisional Application No. 60/186,575 filed on Mar. 2, 2000 and titled "FINITE IMPULSE RESPONSE (FIR) FILTER COMPILER", now expired, all of which are incorporated by reference herein in their entirety and for all purposes.

FIELD OF THE INVENTION

This invention relates generally to programmable logic devices and specifically to the implementation of a finite impulse response (FIR) digital filter in programmable logic devices.

BACKGROUND OF THE INVENTION

Many digital systems use signal processing to remove unwanted noise, to provide spectral shaping, or to perform signal detection or analysis. Two types of filters that provide these functions are Finite Impulse Response (FIR) filters and infinite impulse response (IIR) filters. FIR filters are used in systems that require linear phase and have an inherently stable structure whereas IIR filters are used in systems that can tolerate phase distortion. Typical filter applications include signal preconditioning, band selection, and low pass filtering.

FIR filters have a linear phase and inherent stability that makes FIR filters sufficiently attractive to be designed into a large number of systems. Unfortunately, however, since FIR filters are of a higher order than are IIR filters, implementing a FIR filter is generally more computationally expensive. A conventional FIR filter is basically a weighted tapped delay line. The filter design process involves identifying coefficients that match the frequency response specified for the particular system for which the FIR filter is being designed. In this way, the coefficients determine the response of the filter. The signal frequencies that pass through the filter can be modified simply by changing the values of the coefficients or by adding more coefficients.

Digital signal processors (DSPs) have a limited number of multiplier accumulators (MACs) which require many clock cycles to compute each output values since the number of cycles is directly related to the order of the filter. Once a particular FIR filter design has been finalized, the FIR filter can take the form of a dedicated hardware solution which typically can achieve one output per clock cycle. However, by using a programmable integrated circuit, such as a programmable logic device (PLD) such as those manufactured by the Altera Corporation of San Jose Calif., a fully parallel, pipelined FIR filter implemented, or "fitted", in a PLD and can operate at data rates above 100 million samples per second (MSPS), thereby making PLDs an ideal platform for high speed filtering applications.

Unfortunately however, conventional approaches to implementing a particular FIR filter in a PLD is time consuming and expensive. More specifically, a designer must first define an ideal frequency response for the desired filter. Based upon the ideal frequency response, the filter designer then must generate a set of desired FIR filter response data in the form of design architectural data blocks. Based upon the desired filter response, the behavioral characteristics of the FIR filter are then determined based upon floating-point values that are converted to fixed-point filter coefficients. Once the particular filter coefficients have been calculated, then an interim hardware filter architecture is determined. By hardware filter architecture it is meant whether the FIR filter is to be configured as a parallel or serial type FIR filter. In some applications, a serial type FIR filter configuration may be appropriate whereas in other applications a parallel type FIR filter configuration may be appropriate. A simulation must then be iteratively run on the interim hardware filter architecture to ascertain whether or not FIR filter, as currently configured, meets the original design specifications. Once an appropriate filter design has been established based upon an acceptable simulation run, the FIR filter design is synthesized and fitted to a target PLD by an appropriate placing and routing program.

Typical cycle times for the conventional FIR filter design cycle described above takes on the average, at least 6 weeks to complete. This long cycle time increases costs, slows introduction of new products, and delays release of system upgrades all of which negatively affect profitability and new product introductions.

Therefore, what is desired is an efficient method and apparatus for implementing a FIR filter in a programmable logic device.

SUMMARY OF THE INVENTION

The invention relates to an improved method, apparatus and system for building a frequency filter is described. In one embodiment, a filter compiler suitable for implementing a desired filter having an associated desired filter spectral response is disclosed. The compiler includes a filter coefficient generator suitably arranged to provide a first set of filter coefficients corresponding to the desired filter spectral response and a filter spectral response analyzer coupled to the filter coefficient generator for providing an expected filter spectral response based in part upon the first set of filter coefficients. When the expected filter spectral response is substantially the same as the desired filter spectral response, then the first set of filter coefficients is a second set of filter coefficients. The compiler also includes a filter resource estimator coupled to the filter spectral response simulator for estimating an implementation cost of the filter based upon the second set of filter coefficients as well as a filter compiler unit coupled to the resource estimator arranged to compile a desired filter implementation output file.

The compiler provides a desired filter hardware implementation file and a desired filter simulation file. The desired filter simulation file provides filter simulation input data and the desired filter hardware implementation file provides a routing and placing dataset suitable for fitting the desired filter in a programmable logic device such as a PLD.

In a preferred embodiment, the filter is a finite impulse response (FIR) filter.

In another embodiment, a method of compiling a desired filter having an associated filter spectral response is disclosed. A first set of filter coefficients corresponding to the filter spectral response is provided and based upon the first set of filter coefficients, an expected filter spectral response is then generated. The desired filter spectral response is then compared to the expected filter spectral response. An implementation cost of the desired filter is estimated and a filter implementation output file is then generated.

In yet another embodiment, a method of building a decimating FIR filter by a compiler using a plurality of domain polyphases wherein each of the plurality of polyphases is represented by a serial filter and wherein a single clock domain is used for each serial filter is disclosed. A first clock rule is applied when an input data width is less than or equal to a decimation factor and a second clock rule is applied when an input data width is greater than the decimation factor.

In a preferred embodiment, the first clock rule includes the following operations, a clock rate is set to an input data rate and an output data rate is set equal to the input data divided by the decimation factor. The input data is held for a quantity N clock cycles where the quantity N is equal to the decimation factor such that all polyphases are switched through at every clock cycle. Whereas the second clock rule includes the following operations, the clock rate is set equal to a speed multiplication factor (SMF1) multiplied by the input data rate where the SMF is a smallest integer such that the SMF1 multiplied by the decimation factor is greater than or equal to the input data width. The output data rate is set equal to the SMF multiplied by the input data rate divided by the decimation factor and the output data rate is held for a quantity L clock cycles, wherein the quantity L is equal to the SMF1 multiplied by the decimation factor, such that all polyphases are switched through at every quantity SMF1 clock cycles.

In still another embodiment, a method of building an interpolating FIR filter by a FIR compiler using a plurality of domain polyphases wherein each of the plurality of polyphases is represented by a serial FIR filter and wherein a single clock domain is used for each serial FIR filter is disclosed. A first clock rule is applied when an input data width is less than or equal to a interpolation factor and a second clock rule is applied when an input data width is greater than the decimation factor.

In a preferred embodiment, the first clock rule includes the following operations, a clock rate is set to an output data rate and an input data rate is set equal to the output data divided by the interpolation factor. The input data is held for a quantity P clock cycles where the quantity P is equal to the interpolation factor such that all polyphases are switched through at every clock cycle. Whereas the second clock rule includes the following operations, the clock rate is set equal to a speed multiplication factor (SMF2) multiplied by the output data rate where the SMF2 is a smallest integer such that the SMF2 multiplied by the interpolation factor is greater than or equal to the input data width. The input data rate is set equal to the SMF2 multiplied by the output data rate divided by the interpolation factor and the input data rate is held for a quantity R clock cycles, wherein the quantity R is equal to the SMF2 multiplied by the interpolation factor, such that all polyphases are switched through at every quantity SMF2 clock cycles.

In another embodiment, a filter compiler system including a filter resource estimator is provided. The filter resource estimator is configured to estimate an implementation cost of a filter. The filter compiler system determines whether the implementation cost is acceptable and updates a design of the filter upon determining that the implementation cost is unacceptable.

BRIEF DESCRIPTION OF THE DRAWINGS

The invention, together with further advantages thereof, may best be understood by reference to the following description taken in conjunction with the accompanying drawings in which, FIG. 1 describes a system for generating a FIR filter in accordance with an embodiment of the invention.

FIG. 14 shows a GUI suitable for specifying a filter architecture in accordance with an embodiment of the invention.

DETAILED DESCRIPTION OF THE INVENTION

Figure 1:
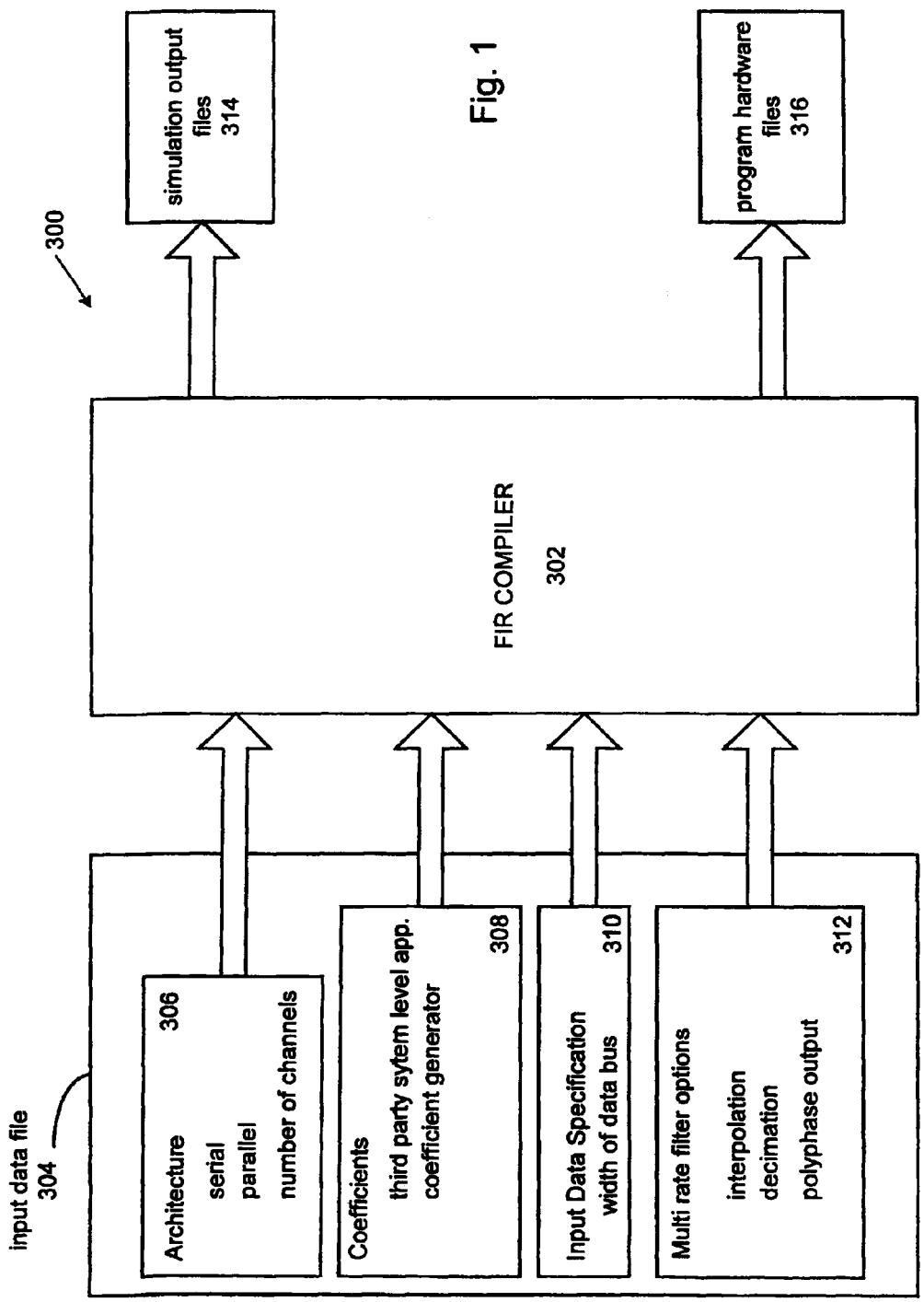

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a novel FIR filter compiler and methods of use thereof.

Reference will now be made in detail to an embodiment of the invention. An example of the embodiment is illustrated in the accompanying drawings. While the invention will be described in conjunction with an embodiment, it will be understood that it is not intended to limit the invention to one preferred embodiment. To the contrary, it is intended to cover alternatives, modifications, and equivalents as may be included within the spirit and scope of the invention as defined by the appended claims.

Broadly speaking, an apparatus, system, and method for efficiently designing a filter suitable for being fitted to a programmable logic device are disclosed. In one embodiment, a filter designer provides an input data file that includes filter characterization data to a filter compiler. The compiler interactively provides a filter cost analysis and a filter performance analysis. In a preferred embodiment, the cost analysis is performed substantially in parallel with the performance analysis. By "cost" it is meant the total number of resources (programming, memory, logic, etc.) required to implement the particular filter design whereas a performance analysis can involve determining speed, power, and other factors associated with the particular design. By performing the cost analysis and performance analysis in parallel, the compiler substantially reduces overall filter design cycle time as compared to conventional approaches to filter synthesis. In addition to greatly reducing the overall filter cycle time, the compiler is capable of providing, as output, a simulation file compatible with, for example, MATLAB, VHDL, and Verilog HDL simulation models. In addition to providing simulation files, the FIR compiler is capable of providing hardware implementation files such as, for example, MAX+PLUS II and/or Quartis vector files.

Due to the fixed number of clock drivers available in a programmable logic device, the compiler is capable of optimizing clock design rules when implementing a decimating finite impulse response (FIR) filter using a serial filter. The decimating FIR filter is built by using a polyphase decomposition where each of the polyphases is a serial FIR filter. In this way, a single clock domain can be used for each serial filter as well as for the final adder.

Similarly, an interpolation FIR filter can be implemented using a serial FIR filter by using a polyphase decomposition where each of the polyphases is a serial FIR filter. In this way, a single clock domain can be used for each serial filter as well as the state machine that controls the select bus of the final multiplexer.

The compiler will now be described in terms of a finite impulse response (FIR) compiler used to implement a FIR filter in a programmable logic device (PLD). It should be noted, however, that any type frequency filter (such as an infinite impulse response, or IIR, filter) and any type configurable device, such as an ASIC type integrated circuit, for example, can also be used and is therefore included within the scope and intent of the described invention.

FIG. 1 describes a system 300 for generating a FIR filter in accordance with an embodiment of the invention. The system 300 is generally used by system level designers for designing and evaluating potential FIR filter implementations in programmable integrated devices, such as a programmable logic device (PLD). Such PLDs as those manufactured by the Altera Corporation of San Jose, Calif. are well suited for implementing these FIR filters. In order to design the appropriate FIR filter, the designer must first evaluate the system requirements in relation to the performance desired, spectral characteristics of the FIR filter, and overall resource allocation required in order to implement, or build, the designed FIR filter. It should be noted that resource evaluation (silicon area, speed, power, etc.) is a significant factor in determining a final FIR filter design since a FIR filter that requires substantial programming and/or other integrated circuit resources to implement may not be suitable for a particular application even though its performance is adequate.

In some cases, a multi-rate filter option can be selected appropriate for implementing interpolation and/or decimation filters each with polyphase output using a single clock domain, if desired.

Specifically, still referring to FIG. 1, the designer provides an input data file 304 describing various filter characteristics such as those discussed above. The designer can provide an architecture (serial or parallel) file 306 that specifies either serial or parallel type FIR filter architecture. For serial filters, the use of particular logic elements can be specified. Using the FLEX architecture PLDs, for example, manufactured by the Altera Corporation of San Jose, Calif., the designer can specify the use of either Embedded Array Blocks (EABs) or logic cells to implement the filter. In either case, whether specifying serial or parallel, the use of pipelining can also be selected. When designing digital signal processing (DSP) systems, two FIR filters may be required having the same spectral response (i.e., the same coefficients). In those cases where high speed is not required, the design can share one FIR filter thereby using fewer resources that would otherwise be used with two identical individual FIR filters.

A filter coefficient file 308 is provided in order to provide the FIR compiler 302 with the desired spectral response characteristics of the FIR filter to be implemented. In the described embodiment, the FIR compiler 302 can obtain filter coefficients in many ways, such as for example, by reading filter coefficients that have been exported from a third party system level application or generated by a built in coefficient generator (not shown) that uses the designer's desired spectral response. In either case, the filter coefficients can be scaled based upon a selected number of bits of precision in which case the FIR compiler 302 detects any symmetries and applies them when appropriate.

In the described embodiment, the FIR compiler 302 can automatically create coefficients based upon a user specified number of taps for various types of filters such as, low pass high pass, band pass band reject, raised cosine, and root raised cosine. The user can adjust the number of taps, cut-off frequencies, sample rate, filter type in order to build a custom frequency response. Each time the settings are applied, the FIR compiler 302 calculates the corresponding coefficient values and generates the associated frequency response based on a logarithmic scale. When the FIR compiler 302 reads these coefficients, it automatically determines any symmetry and selects the appropriate architecture.

Many FIR filters have symmetrical coefficient values. For example, a FIR filter having three coefficients $a_0$, $a_1$, and $a_2$ would be symmetric if $a_0=a_2$ and anti-symmetric if $a_0=-a_2$. Accordingly, the FIR compiler 302 examines the coefficients and automatically determines the filter symmetry, even, odd, or none. After detecting symmetry, the FIR compiler selects an optimum algorithm to minimize the amount of computation needed.

An input data specification file 310 can be used to specify the width of the input data bus. In a preferred embodiment, the data bus width extends from at least 4 bit wide to at least 32 bits wide as well as providing the option of whether or not the bus is signed or unsigned. It should be noted the FIR compiler 302 automatically determines the output bit width for full precision based upon the actual coefficient values and the input bit width. These two parameters define the maximum positive and negative output values in which case the FIR compiler 302 extrapolates the number of bits required to represent the range of output values (for full precision, this is the number of bits that must be used in the system). If so desired, the precision of the FIR filter can be reduced by removing bits for the most significant bit (MSB) by way of truncation or saturation, or from the least significant bit (LSB) by way of truncation or rounding.

In those cases where a multi-rate filter is desired, a multi-rate filter option input file 312 is used to direct the FIR compiler 302 to create multi-rate FIR filters using interpolation and/or decimation. As part of the multi-rate filter option input file 312, interpolation and/or decimation factors are included as well as enabling the polyphase, single time domain output option.

In response to the various supplied input parameters, the FIR compiler automatically provides a simulation output file 314 and a program hardware file 316. The simulation output file 314 includes several types of simulation files such as, for example, MAX+PLUS II vector files, MATLAB M-Files, Simulink Model Files, Verilog HDL models, as well as VHDL output files.

Figure 2:
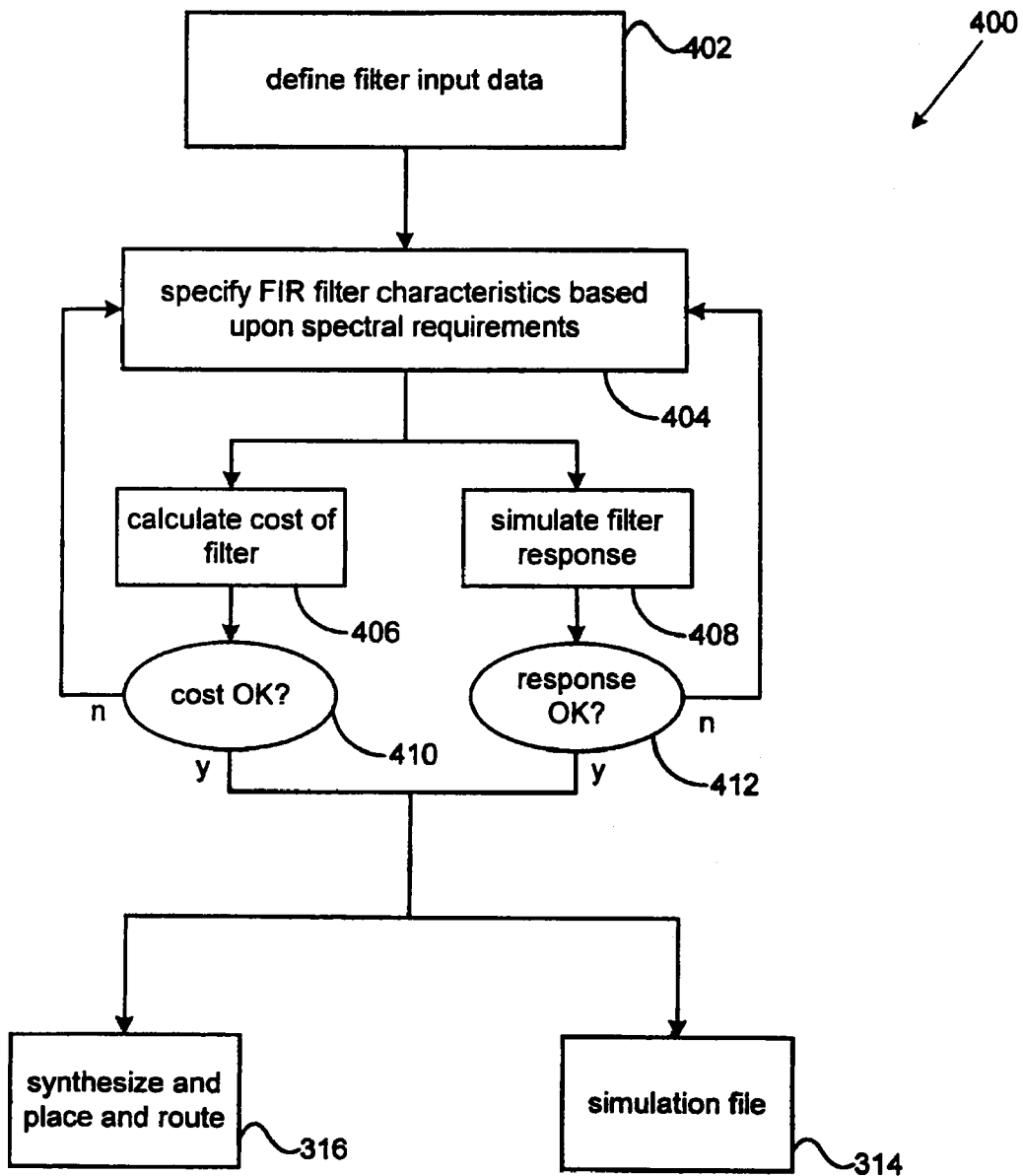
FIG. 2 shows a flowchart detailing a process for implementing a FIR filter using the FIR compiler shown in FIG. 1 in accordance with an embodiment of the invention.

Turning now to FIG. 2, a flowchart detailing a process 400 for implementing a FIR filter using the FIR compiler 302 in accordance with an embodiment of the invention is shown. The process 400 begins at 402 by the user defining FIR filter characteristics in a FIR compiler input data file. The FIR compiler then specifies the appropriate FIR filter characteristics based upon the particular spectral requirements of the system for which the FIR filter is to be incorporated at 404.

Once the FIR compiler has specified a particular FIR filter, the FIR compiler substantially simultaneously calculates the "cost" of the FIR filter at 406 and simulates the expected response of the FIR filter at 408. By "cost" it is meant the total number of resources (programming, memory, logic, etc.) required to implement the particular FIR filter design. At 410 and 412, respectively, a determination is made whether or not the cost and the filter response are acceptable. Only when both the cost and the simulated response are acceptable are the simulation output file 314 and the hardware implementation file 316 provided. Otherwise, control is passed back to 404 where the FIR filter characteristics are updated based upon the results of the determining at 410 and/or 412.

Figure 3:
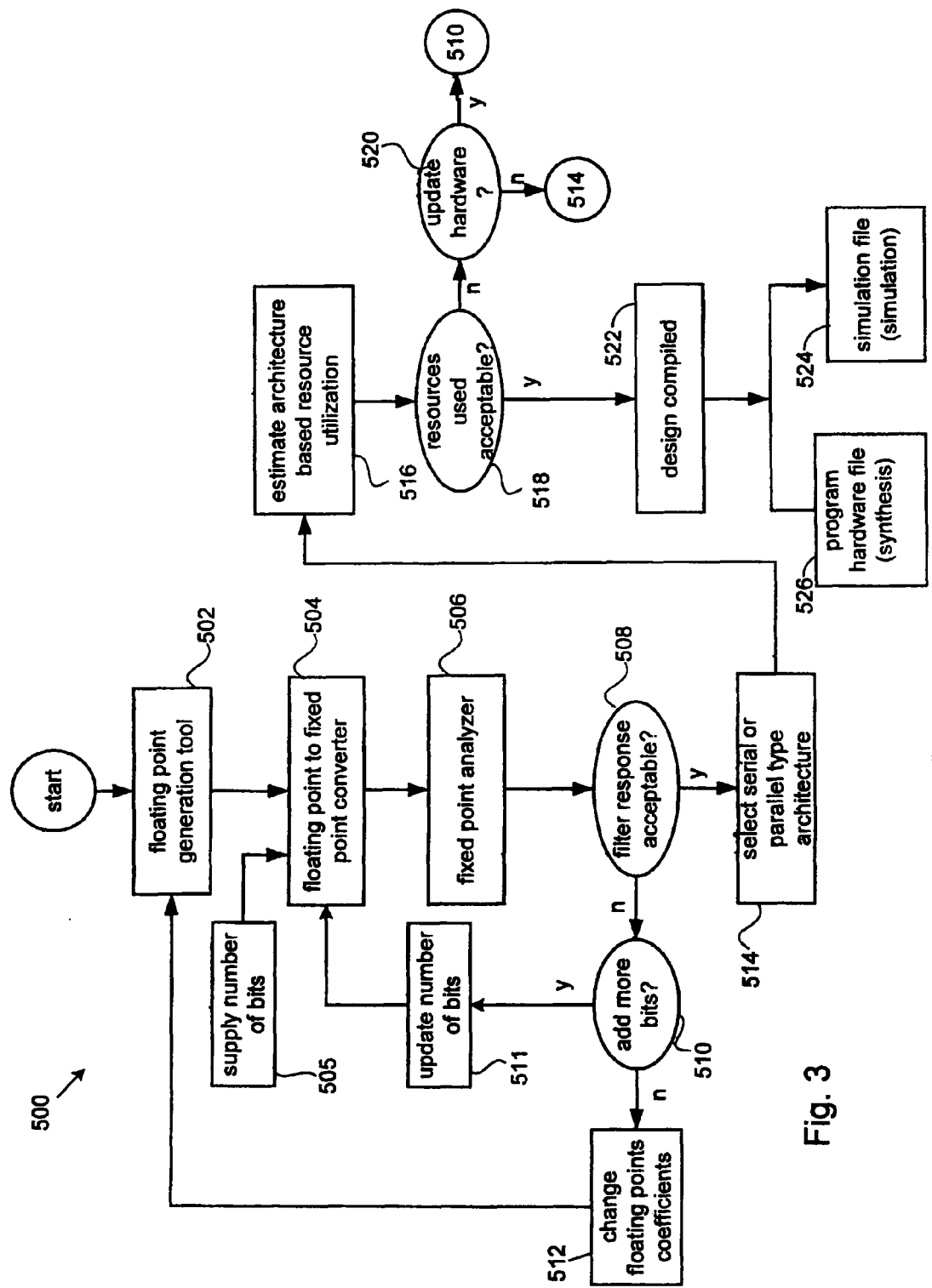
FIG. 3 shows a flowchart detailing a process for implementing a FIR filter using the inventive FIR compiler in accordance with an embodiment of the invention.

FIG. 3 shows a flowchart detailing a process 500 for implementing a FIR filter using the FIR compiler 302 in accordance with an embodiment of the invention. It should be noted that the process 500 is but one possible implementation of the FIR compiler process 400 and as such should not be considered limiting either the scope or intent of the invention. The process 500 begins at 502 by providing a set of floating-point coefficients. In some cases, the floating-point coefficients can be provided by a third party system level application or by a floating-point generation tool. In either case, the floating-point coefficients are converted to fixed-point coefficients at 504 by a fixed-point converter based upon a number of precision bits supplied at 505. Once converted to fixed-point coefficients, a fixed-point analyzer generates an expected FIR filter response at 506. The expected FIR filter response is then compared to the desired FIR filter response and a determination is made at 508 whether or not the expected FIR filter response is acceptable or not. If the expected FIR filter response is not acceptable, then a decision is made at 510 whether or not to add more precision bits. If it is decided to add more precision bits, then the number of precision bits is updated at 511 and control is passed back to 504 in order for the fixed-point converter to re-convert the set of floating-point coefficients into a corresponding set of fixed-point coefficient at the now updated precision. At this point, 506 through 508 are repeated.

Returning back to 510, if it is decided, however, to keep the precision the same but change the floating-point coefficients, the floating-point coefficients are changed at 512 and control is passed back to 502. It should be noted that the loop 502 through 510 and/or 512 are repeated until such time as an acceptable expected FIR response is detected at 508. Once an acceptable FIR filter response is detected at 508, control is passed to 514 where either a serial or a parallel architecture is selected based upon previously supplied user inputs. Once the appropriate architecture is selected for implementing the selected FIR filter, an estimate is made at 516 of the resources to be utilized in implementing the FIR filter in the selected architecture. By resources, it is meant those resources, such as programming, memory, logic, that must be used to implement the particular FIR filter. Once the resources to be used are estimated, a determination is made whether or not the amount of resources estimated to be used is acceptable at 518. If it is determined that the estimated amount of resources is not acceptable, then a determination is made at 520 whether or not the filter hardware (i.e., the basic FIR filter design itself) is to be updated. If it is determined that the filter hardware is to be updated, then control is passed back to 510, otherwise control is passed back to 514, and repeat steps starting at 516.

Returning to 518, if it is determined that the estimated resources to be used in implementing the FIR filter is acceptable, then the particular FIR filter design is compiled at 522. Once compiled, the FIR compiler provides a simulation file at 524 and a hardware file at 526.

Figure 4:
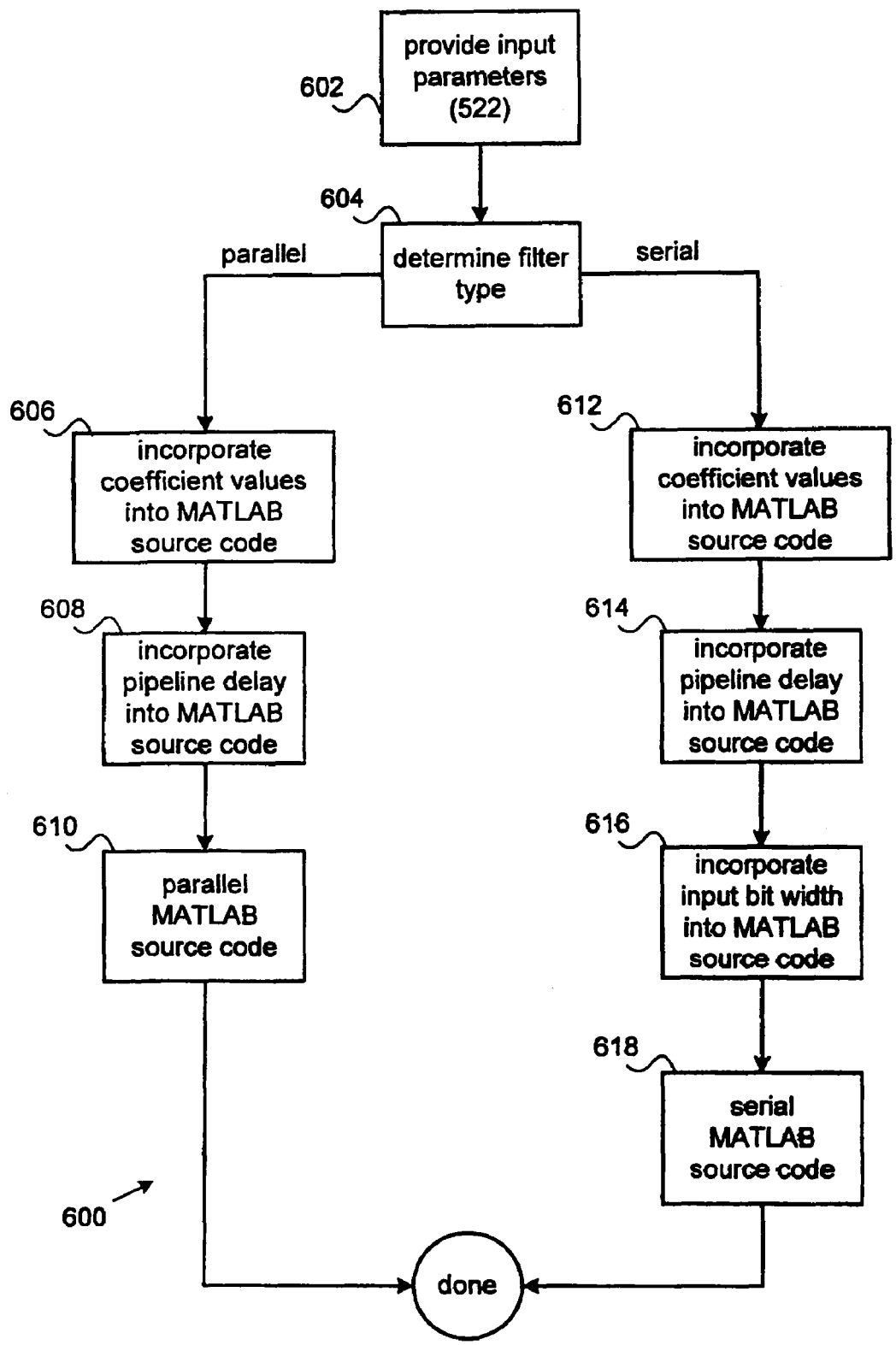
FIG. 4 shows a flowchart detailing a process for providing MATLAB source by the inventive FIR compiler in accordance with an embodiment of the invention.
Figure 5:
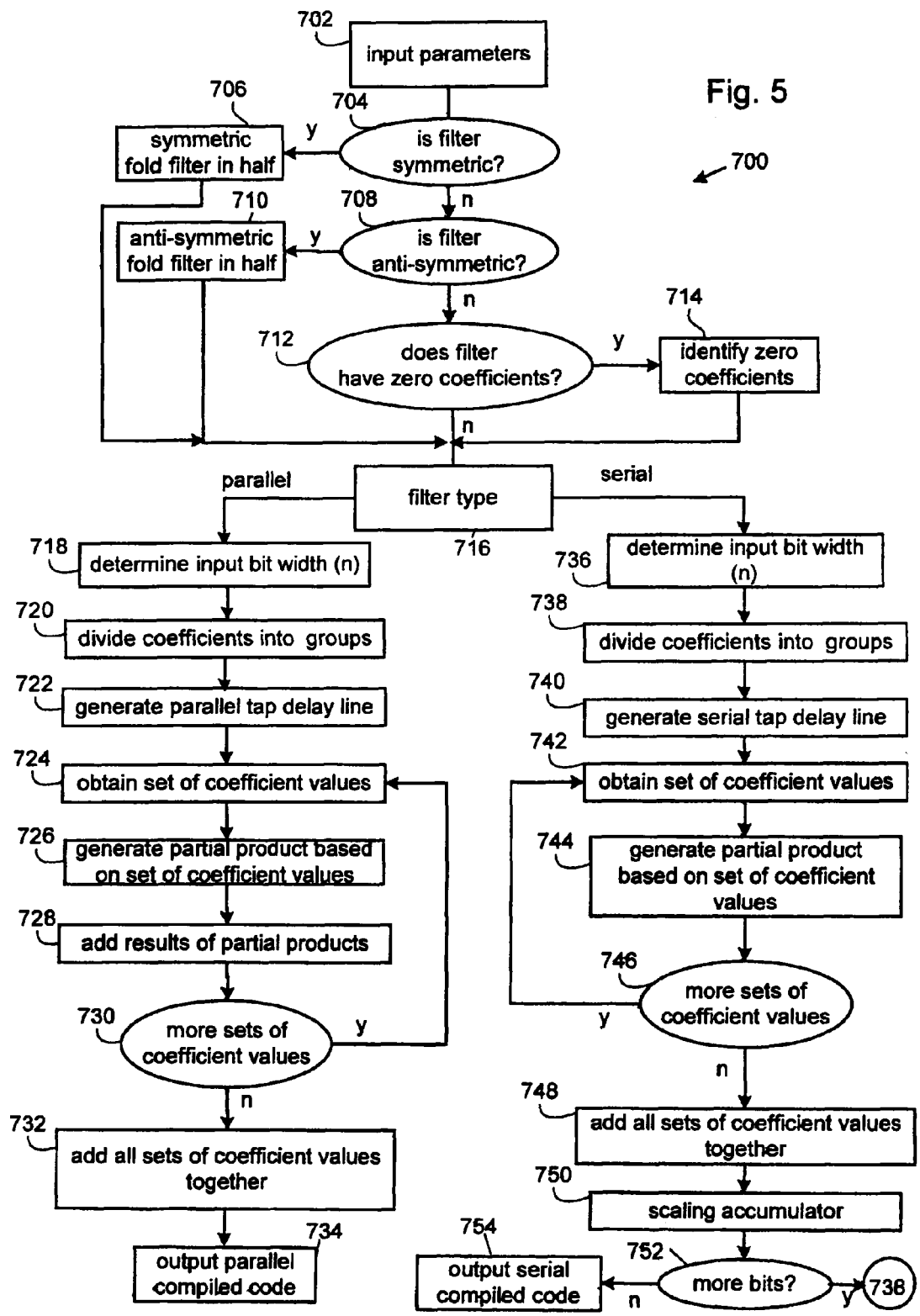
FIG. 5 shows a flowchart for a process suitable for providing compiled code in accordance with an embodiment of the invention.

In a preferred embodiment, the inventive FIR compiler 302 is capable of providing MATLAB source code using a process 600 described by the flowchart shown in FIG. 4. At 602, input parameters are provided that include the number of taps, coefficient values, whether the filter is pipelined, whether the filter is parallel or serial, and whether or not signed or unsigned numbers are used. With reference to FIG. 5, these input parameters can be obtained from the compilation operation 522. At 604, the filter type is determined, and if the filter is a parallel filter then at 606, the parallel coefficient values are incorporated into a MATLAB source code template. At 608, the parallel pipeline delay is incorporated into MATLAB source code template and at 610 the MATLAB source code is then output in the form of a parallel MATLAB source code file.

Returning to 604, if the filter is a serial filter, then at 612, the serial coefficient values are incorporated into a MATLAB source code template. At 614, the serial coefficient values are incorporated into MATLAB source code template and at 616, the input bit width is incorporated into the MATLAB source code template. At 618 the MATLAB source code is then output in the form of a serial MATLAB source code file.

In another embodiment, when compiled code is desired, then a process 700 shown in a flowchart detailed in FIG. 5 is used. At 702, various filter input parameters are provided in an input buffer such as a filter coefficient input buffer. Such input parameters include input bit width, whether signed or unsigned, various coefficient values and their respective precision, whether or not the filter is an interpolating or decimating type filter. Other inputs include whether or not the filter is pipelined and if a serial filter whether EAB or logic cells are used for the implementation.

After the input values have been provided, the FIR compiler determines any inherent symmetry in the filter implementation based upon the various coefficients that have been provided. As well known in the art, symmetry provides for a more efficient filter layout since the filter can be "folded" along the line of symmetry of which there are two types: symmetric and anti-symmetric. When there is no symmetry observed, another approach to optimizing the layout of the filter is to look for any zero coefficients that would then be omitted from the physical layout of the filter. In the described implementation therefore, operations 702 through 714 provide one approach to ascertaining whether any symmetry or zero coefficients exist therefore substantially reducing the potential size and complexity of the FIR filter.

Therefore, at 704, a determination is made whether any symmetry exists based upon the filter coefficients. In one approach, symmetry can be determined by comparing various coefficients for equality (for symmetry) and equal but opposite in polarity (for anti-symmetry). For example, a FIR filter have three coefficients $a_0$, $a_1$, and $a_2$, would be symmetric is $a_0=a_2$ and anti-symmetric if $a_0=-a_2$. If, at 704, the filter is determined to be symmetric, then the filter is symmetrically folded in half at 706. If, however, the filter is determined to be anti-symmetric at 708, then the filter is folded along a line of anti-symmetry at 710. If the filter is determined to be neither symmetric nor anti-symmetric, then a determination is made at 712 whether or not there are any zero coefficients. If there are zero coefficients, then the zero coefficients are identified at 714, otherwise, control is passed to 716 where the filter type is determined.

If the filter type is determined to be a parallel filter at 716, then at 718 the input bit width is determined based upon the input bit width value. The coefficients are then divided in equal groups at 720. In a preferred embodiment, each group includes 4 coefficients, a number based in part upon the number of inputs to a particular logic cell used to implement the filter in a PLD, such as those belonging to the FLEX family of PLDs manufactured by the Altera Corporation of San Jose, Calif. After the coefficients have been divided in groups, a parallel tap delay line is generated at 722 and a group of the coefficients is then retrieved at 724. A partial product is then generated based upon the retrieved coefficients at 726 the results of which is added to any already generated partial products at 728. Next, at 730, a determination is made whether or not there are additional groups of coefficients. If it is determined that there are additional coefficients, then control is passed back to 724, otherwise all the sets of coefficient values are added together at 732 from which the parallel compiled code is output at 734.

Returning to 716, if the filter type is determined to be a serial filter, then at 736 the input bit width is determined based upon the input bit width value. The coefficients are then divided in equal groups. In a preferred embodiment, each group includes 4 coefficients for reasons described above at 738. After the coefficients have been divided in groups, a serial tap delay line is generated at 740 and a group of the coefficients is then retrieved at 742. A partial product is then generated based upon the retrieved coefficients at 744. Next, at 746, a determination is made whether or not there are additional groups of coefficients. If it is determined that there are additional coefficients, then control is passed back to 742, otherwise all the sets of coefficient values are added together at 748 which is then passed to a scaling accumulator at 750. At 752, a determination is made whether or not there are additional bits. If it is determined that there are additional bits, then control is passed back to 738 otherwise, the serial compile code is output at 754.

Figure 6:
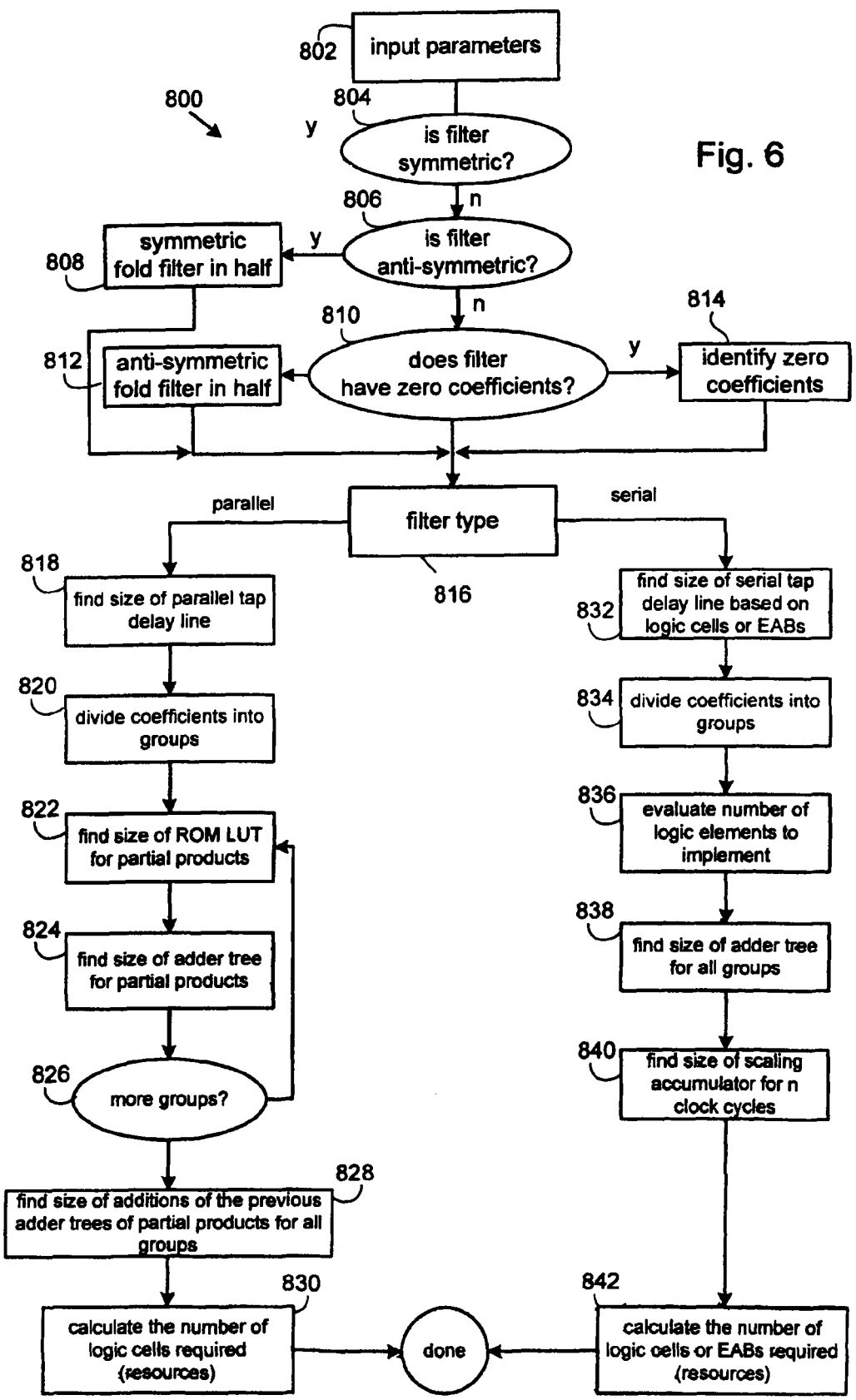
FIG. 6 details a process for estimating the resources required to implement a particular FIR filter in accordance with an embodiment of the invention.

Once the performance of a particular FIR filter designed is deemed acceptable an estimate of the resources required to implement the particular designed as detailed by a flowchart of a process 800 as shown in FIG. 6. At 802, various filter input parameters are input along the lines of those input values described above with reference to FIG. 5. It should be noted that as with the process 700, an initial determination of symmetry, anti-symmetry, and zero coefficients is performed during 804 through 814. After the symmetry (or lack thereof) of the FIR filter is determined, a determination is made at 816 of the filter type. If the filter is a parallel filter, then the size of the parallel tap delay line is determined at 818 and the coefficients are divided into groups at 820 based upon the reasons stated above with regards to process 700. At 822, the size of the ROM LUT for partial products is determined and at 824, the size of the adder tree for the partial products is determined. At 826, a determination is made whether or not there are more groups of coefficients. If there are more coefficients, then control is passed to 822, otherwise, the size of the additions of the previous adder trees of partial products for all groups is determined at 828. At 830, the number of logic cells required to implement the FIR filter is calculated.

Returning to 816, if the filter is a serial filter, then the size of the serial tap delay line is determined at 832 based upon either EABs or logic cells and the coefficients are divided into groups at 834. At 836, the number of logic elements to implement is evaluated. The size of the adder tree for all groups is determined at 838 and the size of the scaling accumulator for n clock cycles is determined at 840. At 842, the number of logic cells or EABs required to implement the FIR filter is then calculated.

FIGS. 7 through 15 are representative graphical user interfaces (GUIs) used to implement a particular embodiment of the invention in the form of the FIR Compiler MegaCore Function MegaWizard Plug-In Manager developed by the Altera Corporation of San Jose, Calif.

Figure 7:
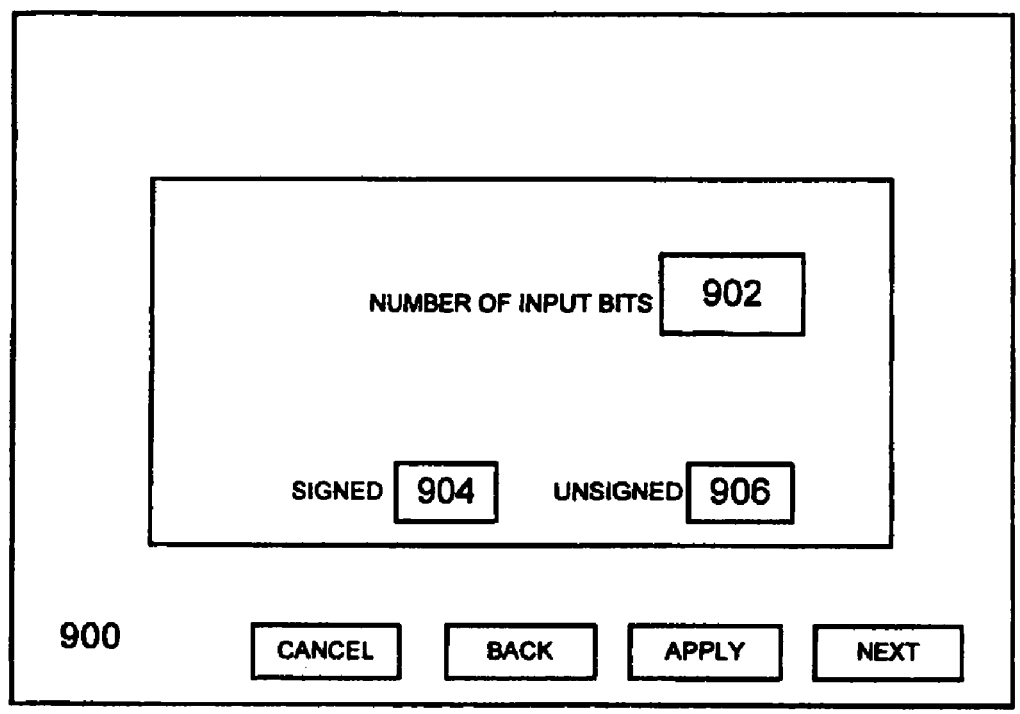
FIG. 7 shows a GUI suitable for entering the number of input bits at an input bit entry data field in accordance with an embodiment of the invention.
Figure 8:
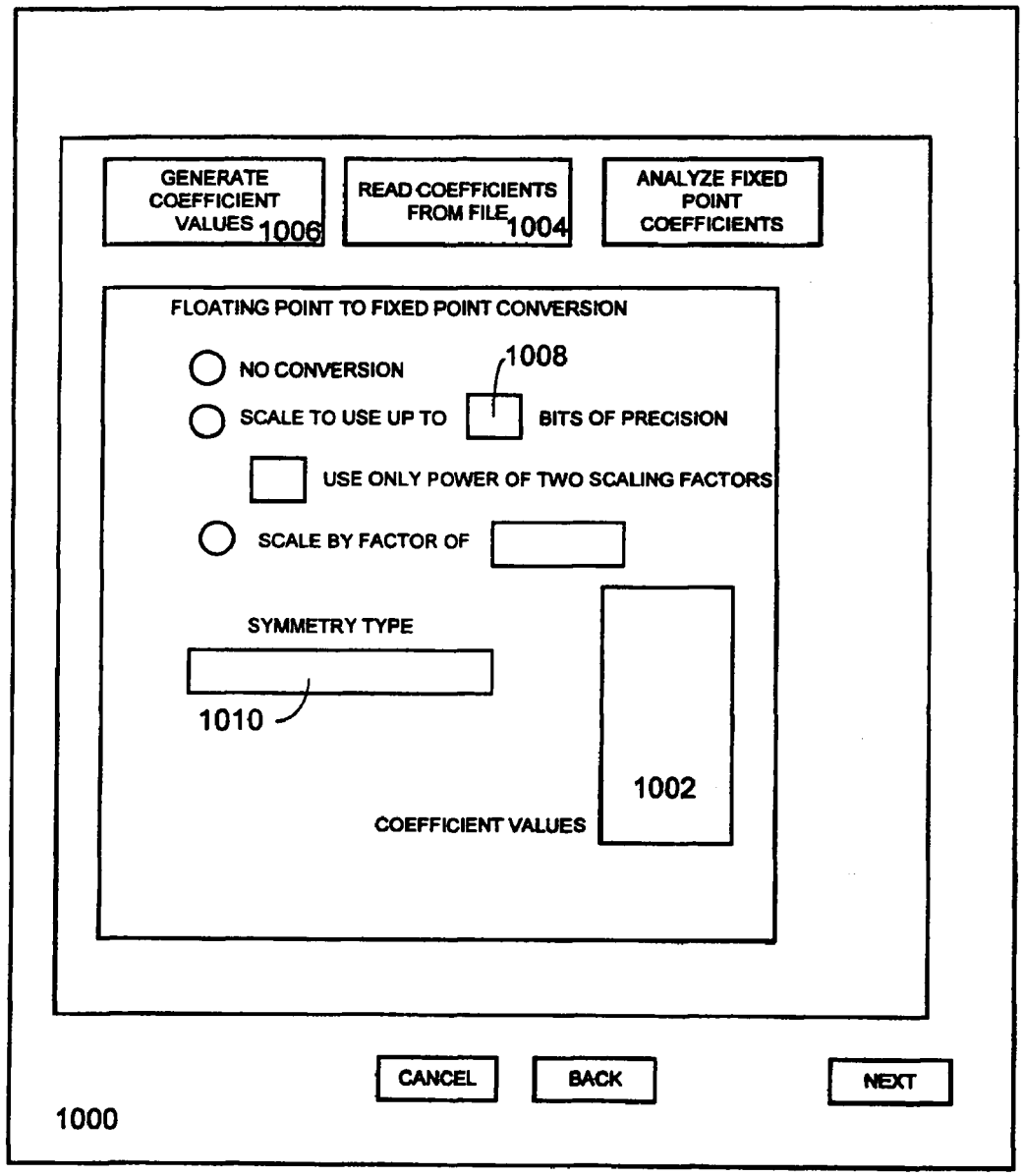
FIG. 8 shows a GUI for entering filter coefficients in accordance with an embodiment of the invention.

Accordingly, FIG. 7 shows a GUI 900 suitable for entering the number of input bits at an input bit entry data field 902 and whether or not the bus is signed or unsigned at a signed input icon 904 and unsigned input icon 906. Once all the appropriate information has been entered, a user enters the input data by clicking an APPLY icon followed by clicking a NEXT icon resulting in display of Specify Coefficients GUI 1000 shown in FIG. 8.

The Specify Coefficients GUI 1000 is used to specify the various coefficients for the FIR filter being compiled. The filter coefficients can be either fixed-point or floating-point and can be manually entered (using input 1002) or can be read from an external file by clicking a "READ COEFFICIENTS FROM FILE" icon 1004. In some cases, the filter coefficients can be automatically generated by clicking "GENERATE COEFFICIENT VALUES" icon 1006. When floating-point coefficients have been entered, floating-point to fixed-point conversion can be avoided by clicking a NO CONVERSION icon. However, in those cases where a floating-point to a fixed-point conversion does occur, the precision of the conversion can be set by inputting the number of bits of precision at an input icon 1008. It should be noted that symmetrical filters are generated automatically, as needed, with the symmetry type (POSITIVE, ANTI-SYMMETRIC) shown in a SYMMETRY TYPE display icon 1010 described with reference to FIG. 10. Once all the appropriate filter coefficients have been specified, they can then be used to generate the desired FIR filter.

Figure 9:
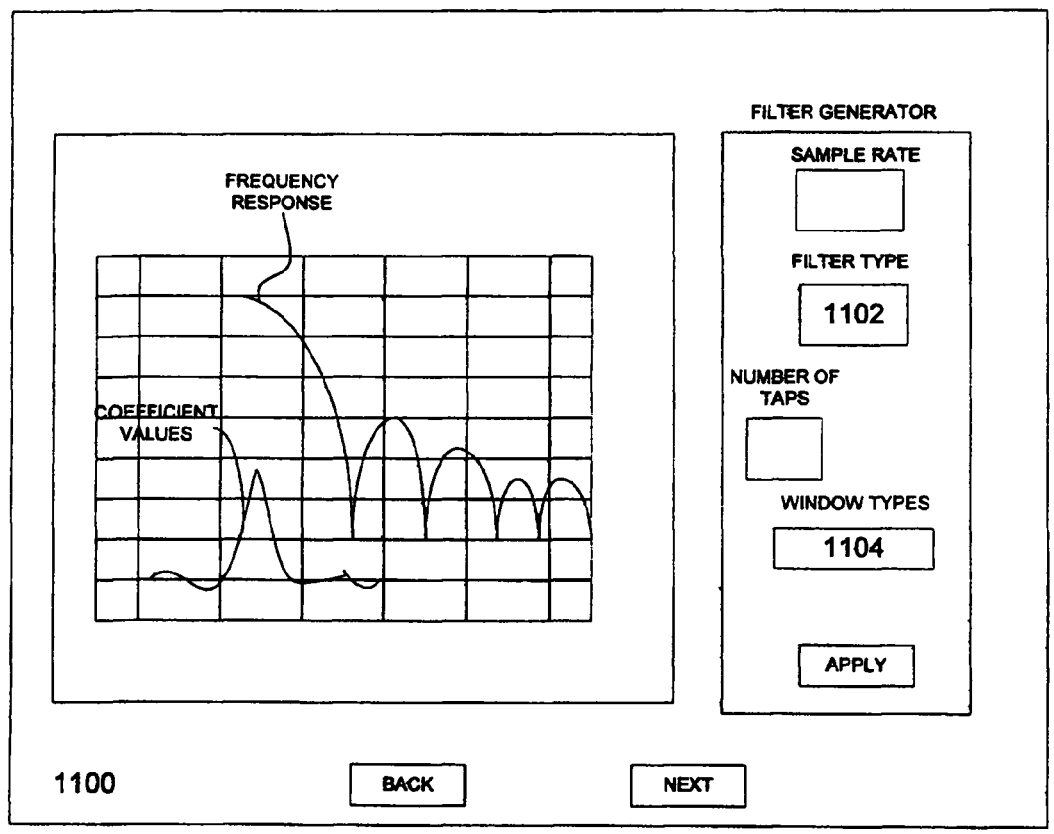
FIG. 9 shows a GUI for a coefficient generator in accordance with an embodiment of the invention.

In those cases where the filter coefficients have been specified to be floating-point coefficients, they must be scaled as shown in a SCALED AND ROUNDED COEFFICIENTS GUI 1100 shown in FIG. 9. At this point, any symmetries are detected and an architecture (i.e., parallel or serial) is selected to create a smaller filter and displays the resulting symmetry in a SYMMETRY TYPE display shown in FIG. 10.

Referring back to FIG. 9, the user can select any number of filter types using a FILTER TYPE input 1102. Such filter types include, for example, a high pass filter, a low pass filter, a band pass filter, a band reject filter, a raised cosine filter, and a root raised cosine filter. In addition, various window types can also be selected by inputting the appropriate window type (i.e., Rectangular, Hamming, Hanning, and Blackman, for example) in a WINDOW TYPE icon 1104.

Figure 10:
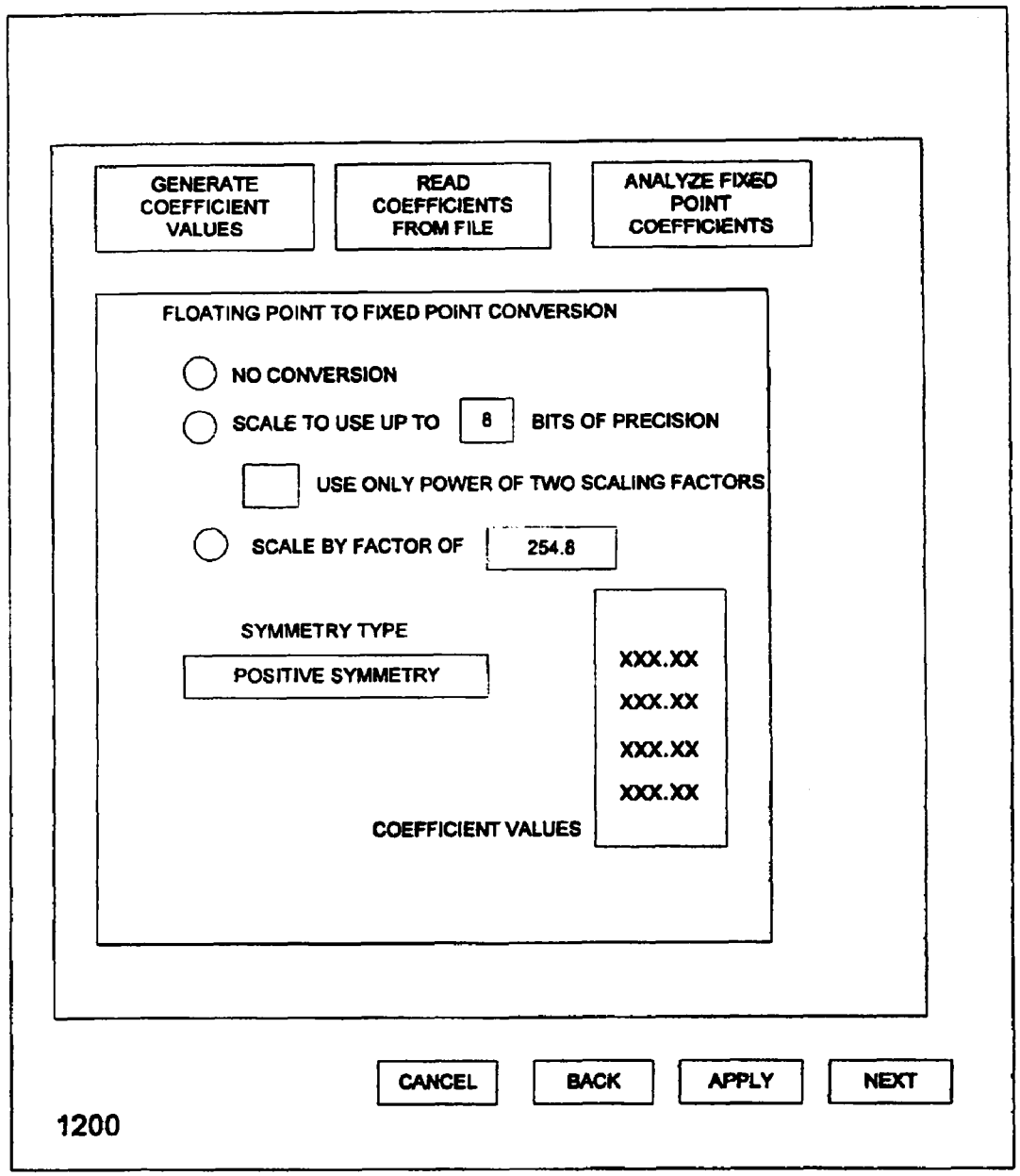
FIG. 10 shows a GUI for scaling and rounding coefficients in accordance with an embodiment of the invention.
Figure 11:
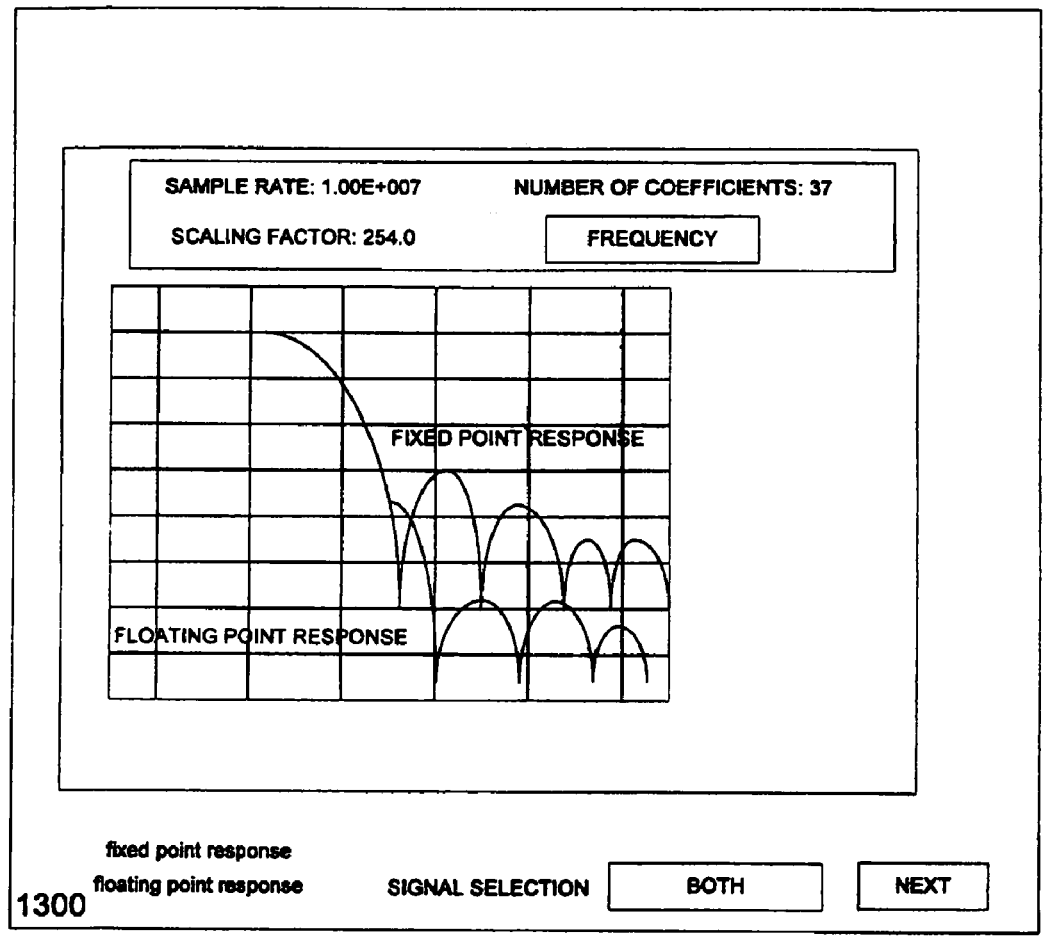
FIG. 11 shows a GUI representing a fixed-point coefficient analyzer in accordance with an embodiment of the invention.
Figure 12:
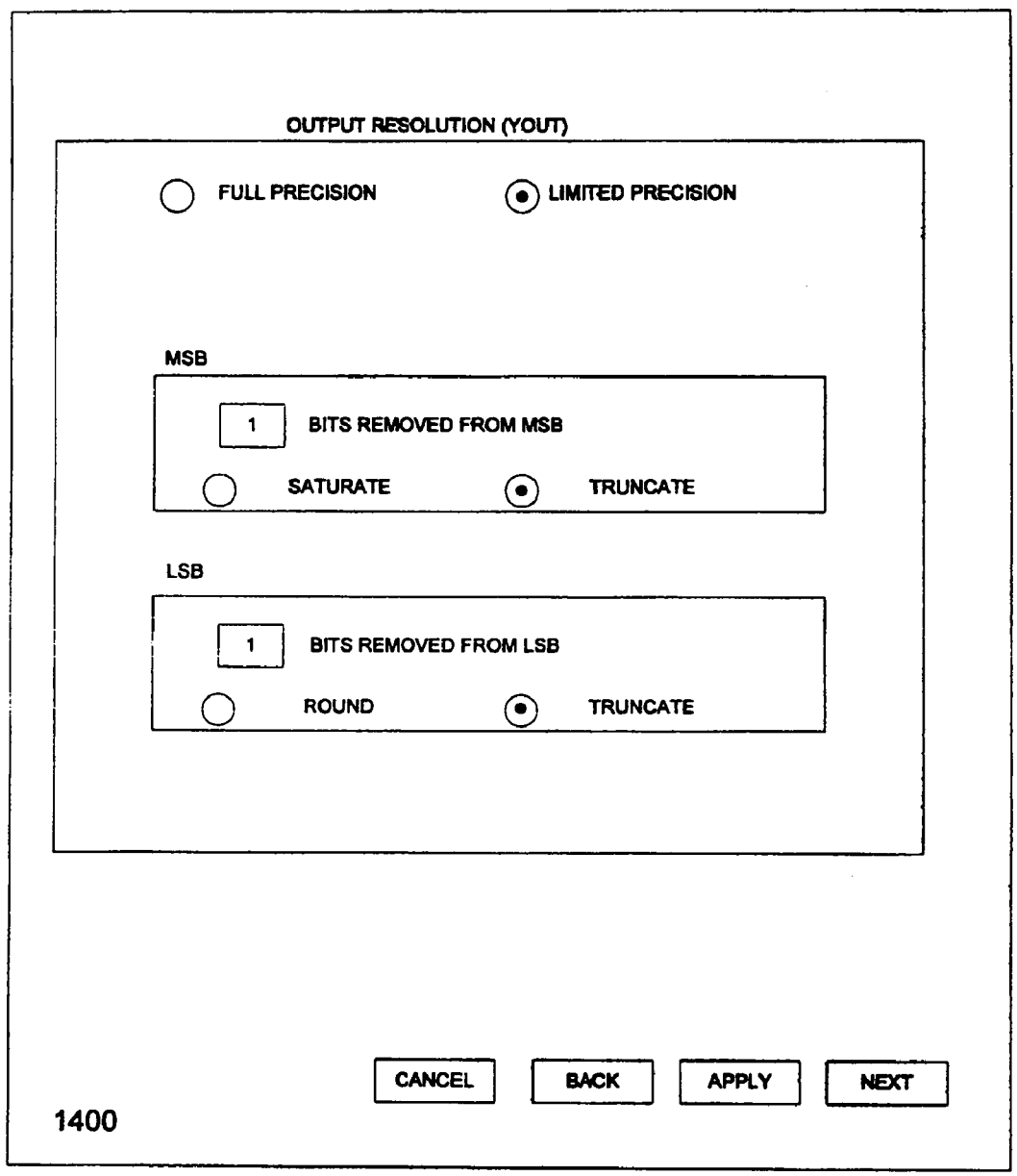
FIG. 12 shows a GUI suitable for specifying coefficient precision in accordance with an embodiment of the invention.

After scaling and rounding the coefficients, the resulting fixed-point coefficients can be viewed and compared to the floating-point coefficients as shown in FIG. 10 showing the SPECIFY COEFFICIENTS GUI 1200 with resulting data. A FIXED-POINT COEFFICIENT ANALYZER GUI 1300 allows the user to quickly determine the number of bits of precision required to obtain a desired spectral response. It should be noted, that the user can optionally view the fixed-point response only, the floating-point response only, or in the case shown in FIG. 13, both the floating-point and the fixed-point responses shown side by side.

Based upon the results displayed by the FIXED-POINT COEFFICIENT ANALYZER GUI 1300, a SPECIFY FILTER PRECISION GUI 1400 allows the user to specify the particular precision for the requested FIR filter. For example, the user can specify whether to use full or limited precision for the filtered output (i.e., $Y_{out}$). The inventive FIR compiler also determines the output bit width based upon the actual coefficient values and the input bit width. These two parameters, in turn, define the maximum positive and negative output values. The FIR compiler also extrapolates the number of bits required to represent that range of values. In those cases where limited precision has been selected, the FIR compiler provides an option for either truncating or saturating the most significant bit (MSB) and/or rounding or truncating the least significant bit (LSB). For example, in the case shown in FIG. 12, limited precision has been selected, the MSB has been truncated and the LSB has also been truncated.

Figure 13:
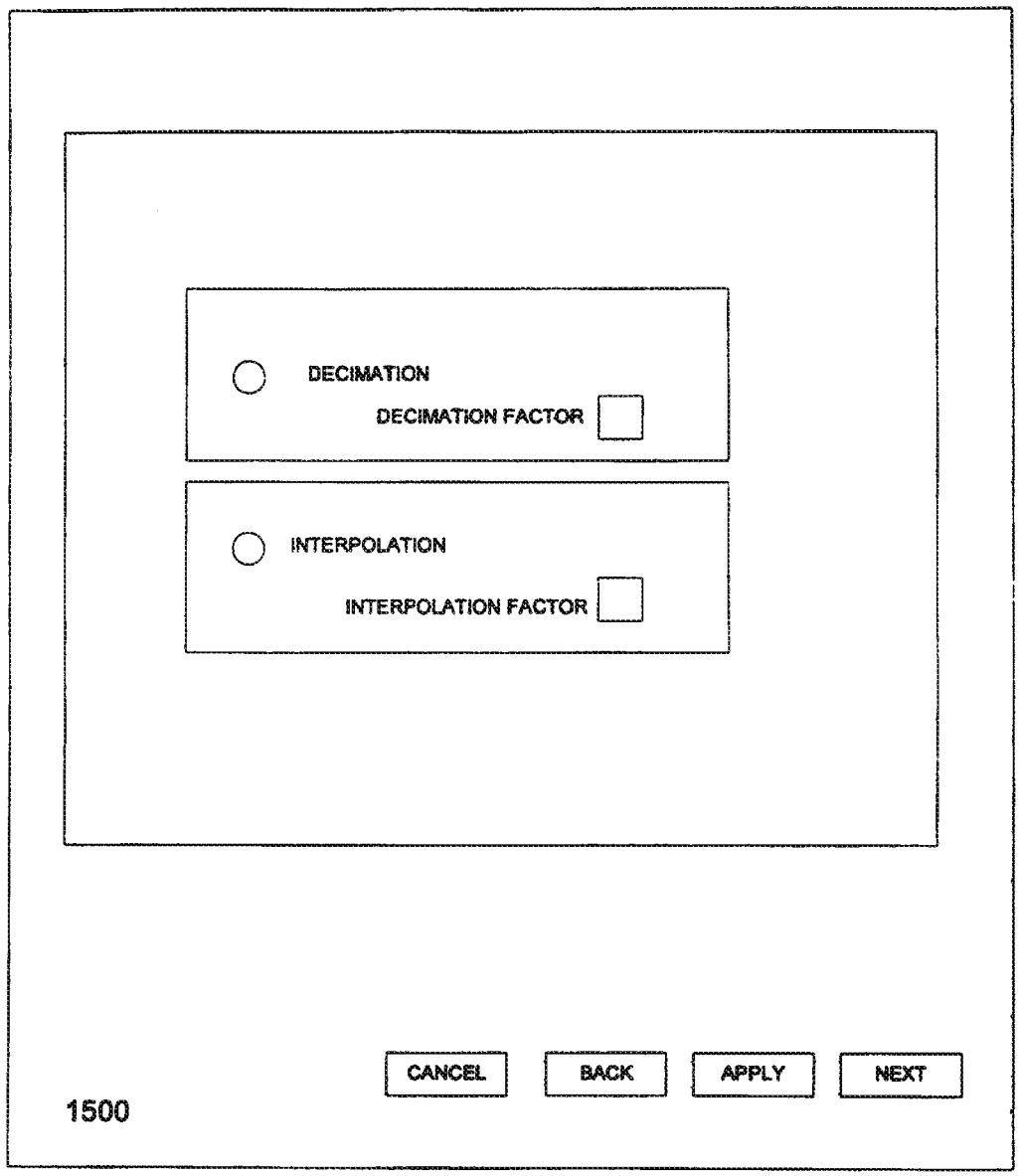
FIG. 13 shows a GUI suitable for specifying if the FIR filter is a decimating or an interpolating type filter in accordance with an embodiment of the invention

The inventive FIR compiler also provides for the option of selecting interpolation or decimation by using a DECIMATION AND INTERPOLATION GUI 1500 shown in FIG. 13. In addition to selecting either decimation or interpolation, a corresponding decimation or interpolation factor can also be selected.

FIG. 14 shows a SELECT A FILTER ARCHITECTURE GUI 1600 in accordance with an embodiment of the invention. By using the SELECT A FILTER ARCHITECTURE GUI 1600, the user can select the filter architecture (i.e., parallel, serial, or any pipelining, for example) and the number of input channels. It should be noted that in the described embodiment, the default architecture is parallel. The FIR compiler 302 automatically calculates the resources the filter will use and display the result of this calculation in a RESOURCE USAGE display 1602 showing, for this example, the estimated size in Embedded Array Blocks (EABs) and/or logic cells and the number of clock cycles required to perform the FIR computation. In a particular embodiment, the latency (i.e., the number of clock cycles before the output is available) is output to a report file.

Figure 15:
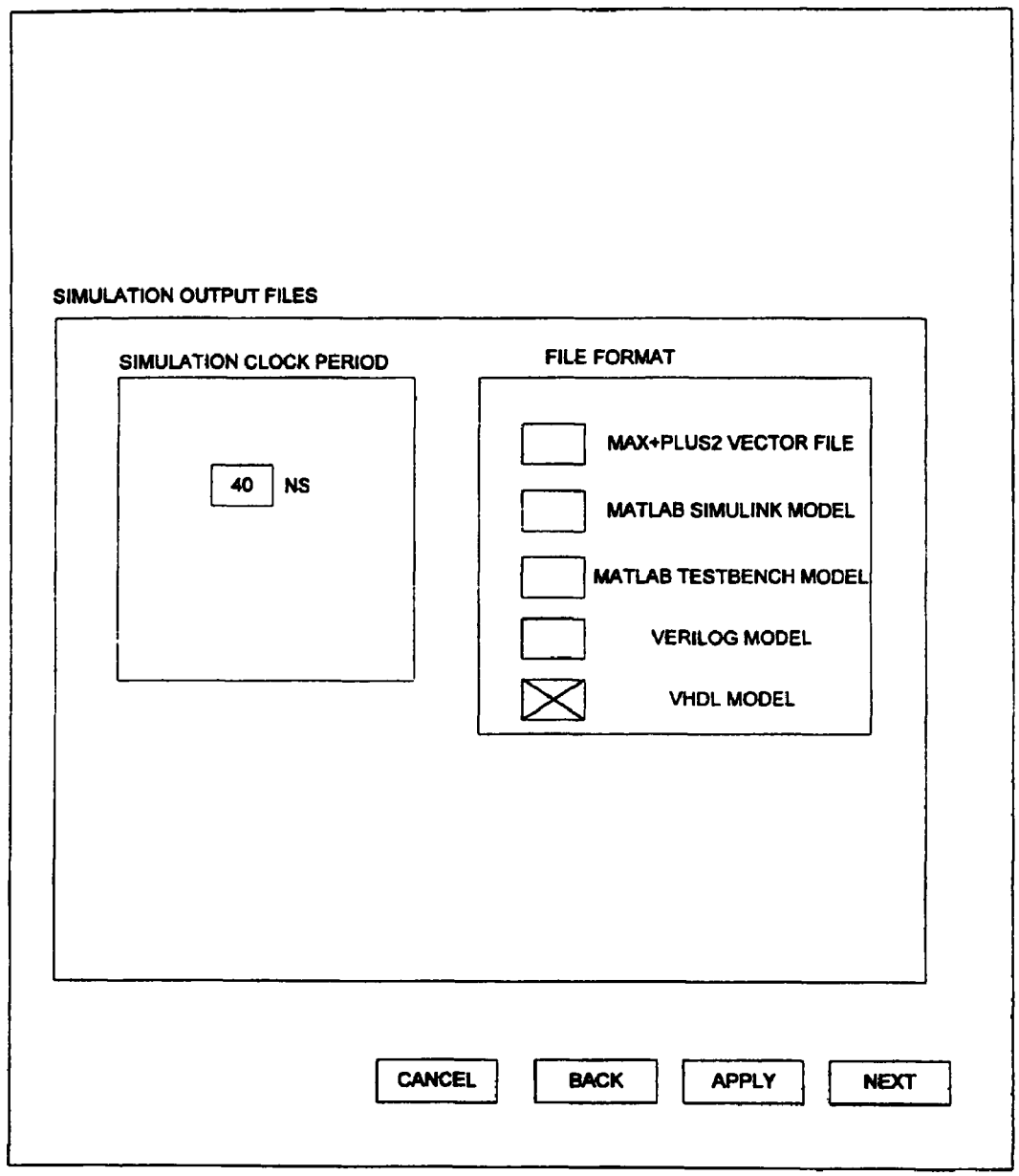
FIG. 15 shows a GUI suitable for selecting an output file type in accordance with an embodiment of the invention.

Once the FIR compiler 302 has completed calculating the FIR filter response, simulation results can be output to simulation output files of any number of formats as shown in FIG. 15 illustrating a CHOOSE OUTPUT FILE TYPES GUI 1700.

In those cases when it would be advantageous to optimize a decimating FIR filter using a serial filter, the FIR compiler is capable of building a decimating FIR filter by using a polyphase decomposition where each of the polyphases is a serial FIR filter. In this way, a single clock domain can be used for each serial filter as well as for the final adder. In order to accomplish this, the FIR compiler has developed the following clock rules. One such set of clock rules requires that in those cases where the input data width is less than or equal to the decimation factor, the clock rate is equal to the input data rate and the output data rate is equal to the input data rate/decimation factor. In addition, the input data is then held for decimation factor clock cycles. In this way the decimation scheme switches through all polyphases at every clock cycle. However, in those cases where the input data width is greater than the decimation factor, the clock rate is set equal to a speed multiplication factor (SMF1) multiplied by the input data rate. In the described embodiment, SMF1 is the smallest integer such that SMF1 multiplied by the decimation factor is greater than or equal to the input data width. In addition, the output data rate is set equal to the (SMF1) multiplied by the input data rate divided by the decimation factor and the output data is then held for (SMF1) multiplied by the decimation factor clock cycles.

In this way the decimation scheme switches through all polyphases at every $(SMF1)^{th}$ clock cycle.

Similarly, an interpolation FIR filter can be implemented using a serial FIR filter by using a polyphase decomposition where each of the polyphases is a serial FIR filter. In this way, a single clock domain can be used for each serial filter as well as the state machine that controls the select bus of the final multiplexer. In order to accomplish this, the FIR compiler has developed the following set of clock rules.

In those cases where the input data width is less than or equal to the interpolation factor the clock rate is equal to the output data rate and the input data rate is equal to the output data rate/interpolation factor. The input data is then held for interpolation factor clock cycles. In this way the interpolation scheme switches through all polyphases at every clock cycle. However, in those cases where the input data width is greater than the decimation factor, then the clock rate is set equal to a speed multiplication factor (SMF2) multiplied by the output data rate. In the described embodiment, the SMF2 is the smallest integer such that SMF2 multiplied by the interpolation factor is greater than or equal to the input data width. The input data rate is equal to the (SMF2) multiplied by the output data rate/interpolation factor such that the input data is then held for (SMF2) multiplied by the interpolation factor clock cycles. In this way the decimation scheme switches through all polyphases at every $(SMF2)^{th}$ clock cycle.

Figure 16:
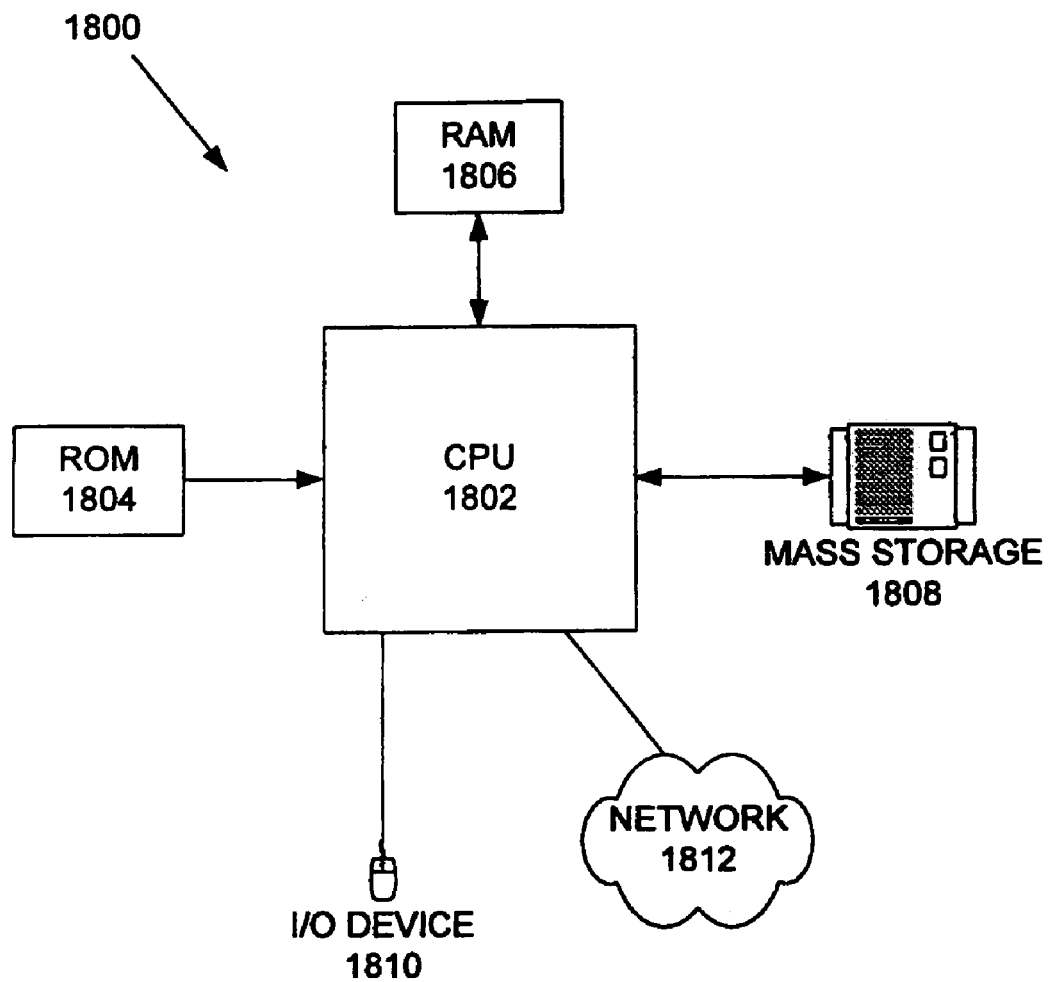
FIG. 16 illustrates a computer system employed to implement the invention.

FIG. 16 illustrates a computer system 1800 or any imaging-enabled computing appliance/device that is employed to implement the invention. The computer system 1800 or, more specifically, CPUs 1802, may be arranged to support a virtual machine, as will be appreciated by those skilled in the art. As is well known in the art, ROM acts to transfer data and instructions uni-directionally to the CPUs 1802, while RAM is used typically to transfer data and instructions in a bi-directional manner. CPUs 1802 may generally include any number of processors. Both primary storage devices 1804, 1806 may include any suitable computer-readable media. A secondary storage medium 1808, which is typically a mass memory device, is also coupled bi-directionally to CPUs 1802 and provides additional data storage capacity. The mass memory device 1808 is a computer-readable medium that may be used to store programs including computer code, data, and the like. Typically, mass memory device 1808 is a storage medium such as a hard disk or a tape which generally slower than primary storage devices 1804, 1806. Mass memory storage device 1808 may take the form of a magnetic or paper tape reader or some other well-known device. It will be appreciated that the information retained within the mass memory device 1808, may, in appropriate cases, be incorporated in standard fashion as part of RAM 1806 as virtual memory. A specific primary storage device 1804 such as a CD-ROM may also pass data uni-directionally to the CPUs 1802.

CPUs 1802 are also coupled to one or more input/output devices 1810 that may include, but are not limited to, devices such as video monitors, track balls, mice, scanners, and the like, keyboards, microphones, touch-sensitive displays, transducer card readers, magnetic or paper tape readers, tablets, styluses, voice or handwriting recognizers, or other well-known input devices such as, of course, other computers. Finally, CPUs 1802 optionally may be coupled to a computer or telecommunications network, e.g., an Internet network or an Intranet network, using a network connection as shown generally at 1812. With such a network connection, it is contemplated that the CPUs 1802 might receive information from the network, or might output information to the network in the course of performing the above-described method steps. Such information, which is often represented as a sequence of instructions to be executed using CPUs 1802, may be received from and outputted to the network, for example, in the form of a computer data signal embodied in a carrier wave. The above-described devices and materials will be familiar to those of skill in the computer hardware and software arts.

While this invention has been described in terms of a preferred embodiment, there are alterations, permutations, and equivalents which fall within the scope of this invention. It should also be noted that there are many alternative ways of implementing both the process and apparatus of the present invention. It is therefore intended that the invention be interpreted as including all such alterations, permutations, and equivalents as fall within the true spirit and scope of the present invention.

Therefore, the present examples are to be considered as illustrative and not restrictive, and the invention is not to be limited to the details given herein, but may be modified within the scope of the appended claims along with their full scope of equivalents.

What is claimed is:

1. A filter compiler system comprising a filter resource estimator configured to estimate an implementation cost of implementing a filter within an integrated device, wherein the filter resource estimator is configured to run using a processor on a computing device, the filter compiler system configured to determine whether the implementation cost is acceptable, the filter compiler system configured to update a design of the filter upon determining that the implementation cost is unacceptable.

2. The filter compiler system of claim 1, further comprising a filter spectral response simulator connected to the filter resource estimator and operable to provide an expected filter spectral response upon receiving a set of filter coefficients, wherein the filter spectral response simulator is configured to run using the processor.

3. The filter compiler system of claim 1, further comprising a filter compiler unit connected to the filter resource estimator, the filter compiler unit configured to implement the filter on the integrated device, and the filter compiler unit executed within the processor.

4. The filter compiler system of claim 1, further comprising:
   a filter spectral response simulator connected to the filter resource estimator and operable to provide an expected filter spectral response upon receiving a set of filter coefficients, wherein the filter spectral response simulator is configured to run using the processor; and
   a filter coefficient system connected to the filter spectral response simulator and configured to provide the set of filter coefficients, wherein the filter coefficient system is configured to run using the processor.

5. The filter compiler system as recited in claim 1, wherein the filter is a finite impulse response (FIR) filter.

6. The filter compiler system as recited in claim 5, further comprising a filter compiler unit configured to output a filter implementation output file, the filter compiler unit configured to run using the processor, the integrated device includes a programmable logic device, the filter implementation output file comprises:
   a finite impulse response (FIR) filter hardware implementation file; and
   a finite impulse response (FIR) filter simulation file, the FIR filter simulation file provides FIR filter simulation input data and the FIR filter hardware implementation file provides a routing and placing dataset suitable for fitting the FIR filter in the programmable logic device.

7. The filter compiler system as recited in claim 1, further comprising:
   a filter spectral response simulator connected to the filter resource estimator and operable to provide an expected filter spectral response upon receiving a set of filter coefficients, wherein the filter spectral response simulator is configured to run using the processor;
   a filter coefficient generator connected to the filter spectral response simulator and configured to provide the set of filter coefficients, wherein the filter coefficient generator is configured to run using the processor; and a floating-point filter coefficient converter connected to the filter coefficient generator, wherein when the set of filter coefficients is a set of floating-point filter coefficients, the floating-point filter coefficient converter converts the set of floating-point filter coefficients to a set of fixed-point filter coefficients, wherein the floating-point filter coefficient converter is configured to run using the processor.

8. The filter compiler system as recited in claim 1, further comprising:
a filter spectral response simulator connected to the filter resource estimator and operable to provide an expected filter spectral response upon receiving a set of filter coefficients, wherein the filter spectral response simulator is configured to run using the processor;
a filter coefficient generator connected to the filter spectral response simulator and configured to provide the set of filter coefficients, wherein the filter coefficient generator is configured to run using the processor; and
a filter rounding and scaling unit coupled to the filter coefficient generator, wherein when the set of filter coefficients includes a floating-point initial set of filter coefficient values, the filter rounding and scaling unit scales and rounds the floating-point initial set of filter coefficient values to form the set of filter coefficient values, wherein the filter rounding and scaling unit is configured to run using the processor.

9. The filter compiler system as recited in claim 1, wherein the filter includes one of an interpolating finite impulse response (FIR) filter and a decimating FIR filter, said filter compiler system further comprising a multi-rate FIR filter generator coupled to an input buffer to build a multi-rate FIR filter from one of the interpolating FIR filter and the decimating FIR filter.

10. The filter compiler system as recited in claim 1, wherein the integrated device includes a programmable logic device and the filter is implemented on the programmable logic device.

11. The filter compiler of claim 1, wherein the implementation cost comprises a cost of a set of resources used to implement the filter.

12. The filter compiler system of claim 1, wherein the implementation cost includes a total number of resources used to implement the filter.

13. The filter compiler system of claim 12, wherein the resources include memory or logic resources.

14. A filter compiler system comprising:
a filter resource estimator configured to estimate an implementation cost of implementing a filter within an integrated device, wherein the filter resource estimator is configured to run using a processor on a computing device;
a filter spectral response simulator connected to the filter resource estimator and operable to provide an expected filter spectral response upon receiving a set of filter coefficients, wherein the filter spectral response simulator is configured to run using the processor;
a filter coefficient generator connected to the filter spectral response simulator and configured to provide the set of filter coefficients, wherein the filter coefficient generator is configured to run using the processor; and
a filter input parameter buffer connected to the filter coefficient generator arranged to store a plurality of filter input parameter values suitable for implementing the filter, wherein the plurality of filter input parameter values is a plurality of finite impulse response (FIR) filter input parameter values and wherein the filter is an FIR filter.

15. The filter compiler system as recited in claim 14, wherein the plurality of FIR filter input parameter values include a tap quantity value, a pipeline delay value, a parallel FIR filter architecture indicator value, a serial FIR filter architecture value, an input bandwidth value, and an initial set of FIR filter coefficient values.

16. A method of compiling a filter, comprising:
estimating an implementation cost of implementing the filter within an integrated device by using a set of filter coefficients, wherein said estimating the implementation cost is performed by using a processor;
determining, by the processor, whether the implementation cost is acceptable;
updating, by the processor, a design of the filter upon determining that the implementation cost is unacceptable.

17. A method of claim 16, further comprising:
determining, by the processor, an expected filter spectral response based in part upon the set of filter coefficients;
comparing, by the processor, a desired filter spectral response to the expected filter spectral response; and
determining, by the processor, whether the expected filter spectral response is the same as the desired filter spectral response.

18. The method of claim 16, wherein the filter is a finite impulse response (FIR) filter.

19. The method of claim 16, wherein the implementation cost includes a total number of resources used to implement the filter.

20. The method of claim 19, wherein the resources include memory or logic resources.

21. A computer system, comprising:
means for storing data; and
means for estimating an implementation cost of implementing the filter within an integrated device by using a set of filter coefficients, wherein said means for estimating is coupled to said means for storing data, wherein said means for estimating determines whether the implementation cost is acceptable and said means for estimating updates a design of the filter upon determining that the implementation cost is unacceptable.

22. A computer system of claim 21, wherein said means for estimating outputs an implementation file representing an implementation of the filter upon determining that the implementation cost is acceptable.

23. A computer system of claim 21, wherein the implementation cost includes a total number of resources used to implement the filter.

24. A computer system of claim 23, wherein the resources include memory or logic resources.

25. A method of compiling a filter, comprising:
estimating, by a filter resource estimator, an implementation cost of implementing a filter within an integrated device, wherein the filter resource estimator is configured to run using a processor on a computing device;
providing, by a filter spectral response simulator connected to the filter resource estimator, an expected filter spectral response upon receiving a set of filter coefficients, wherein the filter spectral response simulator is configured to run using the processor;
providing, by a filter coefficient generator connected to the filter spectral response simulator, the set of filter coefficients, wherein the filter coefficient generator is configured to run using the processor; and storing, by a filter input parameter buffer connected to the filter coefficient generator, a plurality of filter input parameter values suitable for implementing the filter, wherein the plurality of filter input parameter values is a plurality of finite impulse response (FIR) filter input parameter values and wherein the filter is an FIR filter.

26. The method of claim 25, wherein the plurality of FIR filter input parameter values include a tap quantity value, a pipeline delay value, a parallel FIR filter architecture indicator value, a serial FIR filter architecture value, an input bandwidth value, and an initial set of FIR filter coefficient values.

27. A system for compiling a filter, comprising:

means for estimating an implementation cost of implementing a filter within an integrated device;

means for providing an expected filter spectral response upon receiving a set of filter coefficients, wherein said means for providing the expected filter spectral response is connected to said means for estimating;

means for providing the set of filter coefficients, wherein said means for providing the set of filter coefficients is connected to said means for providing the expected filter spectral response; and means for storing a plurality of filter input parameter values suitable for implementing the filter, wherein the plurality of filter input parameter values is a plurality of finite impulse response (FIR) filter input parameter values, wherein the filter is an FIR filter, and wherein said means for storing is connected to said means for providing the set of filter coefficients.

28. A computer system of claim 27, wherein the plurality of FIR filter input parameter values include a tap quantity value, a pipeline delay value, a parallel FIR filter architecture indicator value, a serial FIR filter architecture value, an input bandwidth value, and an initial set of FIR filter coefficient values.

* * * * *